United States Patent
Tsukamoto et al.

(10) Patent No.: US 9,081,141 B2
(45) Date of Patent: Jul. 14, 2015

(54) COLOR FILTER SUBSTRATE WITH LIGHT SHIELD MEMBERS OF DIFFERENT THICKNESSES

(71) Applicant: SHARP KABUSHIKI KAISHA, Osaka (JP)

(72) Inventors: Yuto Tsukamoto, Osaka (JP); Katsuhiro Kikuchi, Osaka (JP); Takashi Ochi, Osaka (JP); Shinichi Kawato, Osaka (JP); Manabu Niboshi, Osaka (JP); Tomohiro Kosaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/371,991

(22) PCT Filed: Jan. 16, 2013

(86) PCT No.: PCT/JP2013/050672
§ 371 (c)(1),
(2) Date: Jul. 11, 2014

(87) PCT Pub. No.: WO2013/108783
PCT Pub. Date: Jul. 25, 2013

(65) Prior Publication Data
US 2014/0367675 A1    Dec. 18, 2014

(30) Foreign Application Priority Data
Jan. 19, 2012   (JP) ................... 2012-009443

(51) Int. Cl.
*G02B 5/20* (2006.01)
*H05B 33/12* (2006.01)
(Continued)

(52) U.S. Cl.
CPC .......... *G02B 5/201* (2013.01); *B29D 11/00634* (2013.01); *H01L 27/322* (2013.01); *H01L 27/3246* (2013.01); *H05B 33/12* (2013.01)

(58) Field of Classification Search
CPC ...... G02B 5/201; H05B 33/12; H01L 27/322; H01L 27/3246; H01L 51/5284
USPC ................. 257/43, 98, 91; 359/891; 430/322; 438/29
See application file for complete search history.

(56) References Cited

U.S. PATENT DOCUMENTS 6,207,329 B1 *   3/2001   Shirota et al. .................... 430/7
6,245,469 B1 *   6/2001   Shiba et al. ....................... 430/7
(Continued)

FOREIGN PATENT DOCUMENTS

JP   2002-299044 A   10/2002
JP   2004-361492 A   12/2004
(Continued)

OTHER PUBLICATIONS

Azumi, JP 2009-157034, machine translation into English.*
(Continued)

*Primary Examiner* — Peter Bradford
(74) *Attorney, Agent, or Firm* — Morrison & Foerster LLP

(57) ABSTRACT

A purpose of the present invention is to minimize decrease in an open area ratio while preventing color mixture between adjacent pixels. A color filter substrate (20) includes a substrate and light-shielding members (21, 22) provided in a matrix manner on the substrate, the light-shielding members (21, 22) having different thicknesses on the substrate depending on positions of the light-shielding members (21, 22).

6 Claims, 7 Drawing Sheets

(51) Int. Cl.
H01L 27/32 (2006.01)
B29D 11/00 (2006.01)

(56) References Cited

U.S. PATENT DOCUMENTS

2002/0050958 A1* 5/2002 Matthies et al. ............... 345/55
2011/0101857 A1* 5/2011 Kanatani et al. .............. 313/504
2012/0241750 A1 9/2012 Chikama et al.
2013/0234126 A1* 9/2013 Nakatani ......................... 257/40

FOREIGN PATENT DOCUMENTS

JP 2009-157034 A 7/2009
WO WO-2011/070981 6/2011

OTHER PUBLICATIONS

Tomoki, JP 2004-361492, machine translation into English.*
International Search Report received for PCT/JP2013/050672, mailed on Apr. 23, 2013, 4 pages (2 pages of English translation and 2 pages of ISR).

* cited by examiner

FIG. 1
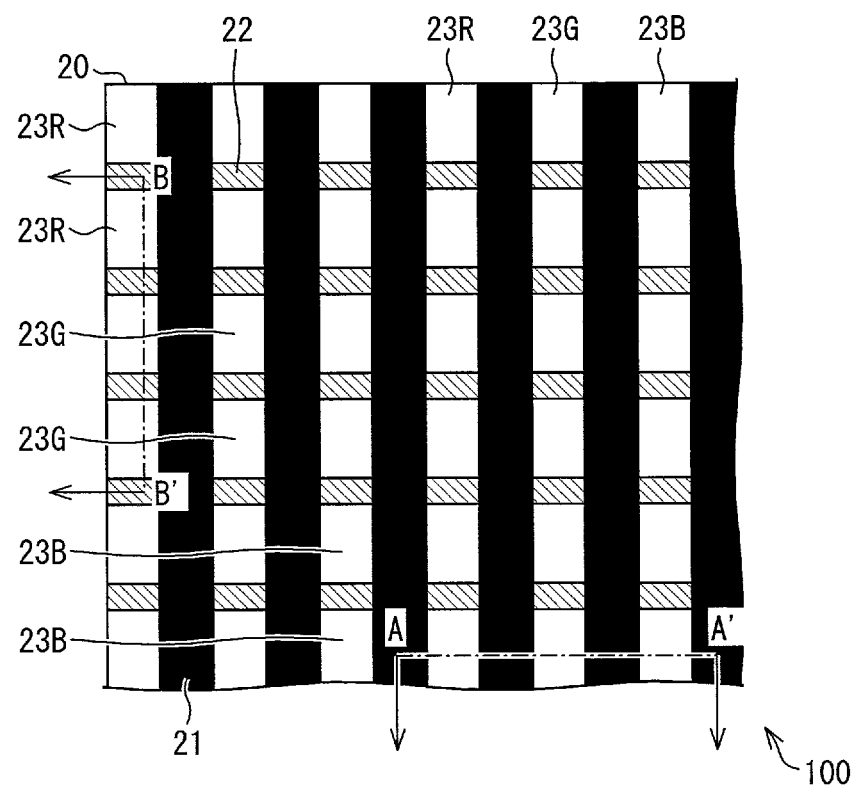
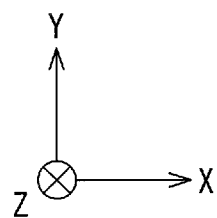

COLOR FILTER SUBSTRATE WITH LIGHT SHIELD MEMBERS OF DIFFERENT THICKNESSES

CROSS REFERENCE TO RELATED APPLICATIONS

This is a U.S. National Phase patent application of PCT/JP2013/050672, filed Jan. 16, 2013, which claims priority to Japanese patent application no. 2012-009443, filed Jan. 19, 2012, each of which is hereby incorporated by reference in the present disclosure in its entirety.

TECHNICAL FIELD

The present invention relates to a color filter substrate capable of preventing decrease in an open area ratio and preventing color mixture between adjacent pixels.

BACKGROUND ART

Organic EL display devices, which include an organic EL element which utilizes electroluminescence (hereinafter referred to as "EL") of an organic material, have been attracting much attention as all-solid-state flat panel displays having excellent properties in terms of low voltage drive, fast response characteristic, self-light emission property, wide viewing angle characteristic, and the like.

An organic EL display device has a configuration in which, for example, an organic EL element is provided on a substrate, which is constituted by a glass substrate or the like and is provided with a TFT (thin-film transistor), and the organic EL element is electrically connected with the TFT.

The organic EL element is a light-emitting element capable of emitting light with high luminance by low voltage DC drive, and has a structure in which a first electrode, an organic EL layer, and a second electrode are laminated in this order.

Known examples of methods for designing an organic EL display device including such an organic EL element to have full color display include (1) a method for arranging organic EL elements, which emit red (R) light, green (G) light, or blue (B) light, as pixels on a substrate, and (2) a method for combining organic EL elements which emit white light with color filters so as to select color of light to be emitted from individual pixels.

The organic EL element is a self-luminous element which emits light in all directions, and is almost a point light source. Furthermore, a gap is formed when attaching a substrate on which the organic EL element is formed by vapor-depositing and a color filter substrate to each other. Consequently, emitted light leaks between adjacent pixels, resulting in color mixture.

FIG. 6 is a cross sectional view illustrating a conventional organic EL display device. In the organic EL display device illustrated in FIG. 6, a color filter substrate (CF substrate) on which a black matrix and color filter layers (CF) are provided is positioned to face a TFT substrate on which white organic EL layers are provided.

White light emitted from a white organic EL layer right below a red CF(R) passes through the red CF(R) and becomes red light, thereby contributing to red display. However, a part of light which is emitted from the white organic EL layer travels in a direction not in parallel with a normal to a color filter substrate 20 and passes through a green CF(G), thereby becoming green light. Furthermore, white light emitted from a white organic EL layer right below a blue CF(B) passes through the blue CF(B) and becomes blue light.

Since the green light forms an incident angle with respect to the CF layer, the green light is mixed with the blue light, resulting in decrease in display quality.

Patent Literature 1 describes a technique in which light-shielding members are provided at a sealing space between an element substrate and a transparent sealing substrate (color filter substrate) so as to prevent color mixture due to leakage of light between adjacent pixels.

FIG. 7 is a view illustrating a cross sectional structure of an organic EL display device disclosed in Patent Literature 1. As illustrated in FIG. 7, the organic EL display device disclosed in Patent Literature 1 has light-shielding members having a height substantially equal to a distance between a transparent sealing member and a second electrode, thereby preventing light transmitted by the second electrode and emitted therefrom from reaching adjacent pixel regions.

Furthermore, Patent Literature 2 describes that a semiconductor oxide such as zinc oxide is used instead of a silicon semiconductor film used for a TFT. FIG. 8 illustrates an example of a cross sectional view of a TFT 900 including a semiconductor oxide layer described in Patent Literature 2.

A semiconductor oxide layer 907a of the TFT 900 is connected with a source line 913as and a drain electrode line 913ad via openings 911as and 911ad, respectively, of an insulating film 909.

A semiconductor oxide layer 907b of an auxiliary capacitor Cs is connected with an auxiliary capacitor electrode (herein, drain electrode 13ad) in an opening 911b of the insulating film 909 and is connected with a pixel electrode 919 in an opening 917b of a protecting film 915.

The TFT using the semiconductor oxide has higher electron mobility, allowing drive with a smaller TFT. This allows designing a high-definition panel with a smaller pixel size.

CITATION LIST

Patent Literatures

[Patent Literature 1]
Japanese Patent Application Publication No. 2002-299044 A (published on Oct. 11, 2002)
[Patent Literature 2]
International Publication No. WO2011/070981 (published on Jun. 16, 2011)

SUMMARY OF INVENTION

Technical Problem

However, the aforementioned conventional techniques have problems below.

As described above, the display device described in Patent Literature 1 is designed such that the height of the light-shielding members is substantially equal to the distance between the transparent sealing member and the second electrode. For prevention of color mixture, it is preferable that a thickness of the light-shielding member is larger. However, enlarging the thickness of the light-shielding member is not preferable since it results in downsizing of an opening and decrease in an open area ratio, and further results in decrease in luminance of the display device. The following description will discuss downsizing of an opening and decrease in an open area ratio.

The light-shielding member as above is patterned by, for example, applying a black photoresist on a whole of a transparent sealing substrate (color filter substrate) and then exposing the transparent sealing substrate with a mask, and developing the transparent sealing substrate with a chemical. In a case of patterning by a positive photoresist, as a thickness of the photoresist is larger, a more amount of light traveling obliquely to a photoresist surface of the transparent sealing member enters a masked photoresist portion in exposure of the transparent sealing substrate.

Consequently, a portion which is supposed to be patterned but in fact etched in the development increases, resulting in a larger risk that such a portion is peeled off from the transparent sealing substrate. In order to reduce the risk of peeling off of the light-shielding member, it is necessary to enlarge a region where the light-shielding member is formed on the transparent sealing member.

However, enlarging the region where the light-shielding member is formed on the transparent sealing member drops the number of pixels or drops an open area ratio.

In a case of patterning by a negative photoresist, as a thickness of the photoresist is larger, a more amount of light traveling obliquely to a photoresist surface enters a masked photoresist portion, so that a portion supposed to be etched is patterned.

That is, enlarging the thickness of the photoresist is not preferable since it results in decrease in precision in patterning and consequently downsizing of an opening and drop in an open area ratio.

A TFT using the semiconductor oxide described in Patent Literature 2 has high electron mobility and consequently allows reducing a pixel size. When the pixel size is smaller, a ratio of an area of the light-shielding member to a display section increases relatively. Accordingly, an open area ratio would be dropped if the light-shielding member would not be downsized as the pixel size is smaller.

The present invention was made in view of the foregoing problem. An object of the present invention is to provide a color filter substrate capable of preventing color mixture between adjacent pixels and preventing drop in an open area ratio.

Solution to Problem

In order to solve the foregoing problem, a color filter substrate of the present invention is a color filter substrate, including: a substrate; and light-shielding members provided in a matrix manner on the substrate, the light-shielding members having different thicknesses on the substrate depending on positions of the light-shielding members.

With the arrangement, in the color filter substrate, at positions where the light-shielding members are provided, light can be transmitted in an amount depending on thicknesses of the light-shielding members on the substrate. Furthermore, at the positions where the light-shielding members are provided, color mixture of light transmitted by the color filter substrate can be prevented depending on the thicknesses of the light-shielding members on the substrate.

In order to solve the foregoing problem, a method of the present invention for manufacturing a color filter substrate is a method for manufacturing a color filter substrate including a substrate and light-shielding members provided in a matrix manner on the substrate, said method including: a first step of forming ones of the light-shielding members which ones constitute portions of the matrix which portions extend in a first direction; and a second step of forming (i) ones of the light-shielding members which ones constitute portions of the matrix which portions extend in a first direction and (ii) ones of the light-shielding members which ones constitute portions of the matrix which portions extend in a second direction crossing the first direction.

With the arrangement, the light-shielding members are formed both in the first step and the second step depending on positions of the light-shielding members on the substrate. Furthermore, the light-shielding members can be formed at least in the first step.

Consequently, in the color filter substrate, the light-shielding members can have different thicknesses on the substrate depending on the positions where the light-shielding members are provided on the substrate.

Advantageous Effects of Invention

In order to solve the foregoing problem, the color filter substrate of the present invention is designed such that the light-shielding members have different thicknesses on the color filter substrate depending on positions where the light-shielding members are provided.

Since the light-shielding members have different thicknesses on the color filter substrate depending on positions where the light-shielding members are provided, it is possible to prevent decrease in drop of an open area ratio while preventing color mixture between adjacent pixels.

BRIEF DESCRIPTION OF DRAWINGS

FIG. 1 is a plan view illustrating an organic EL display element in accordance with one embodiment of the present invention.

Figure 5:
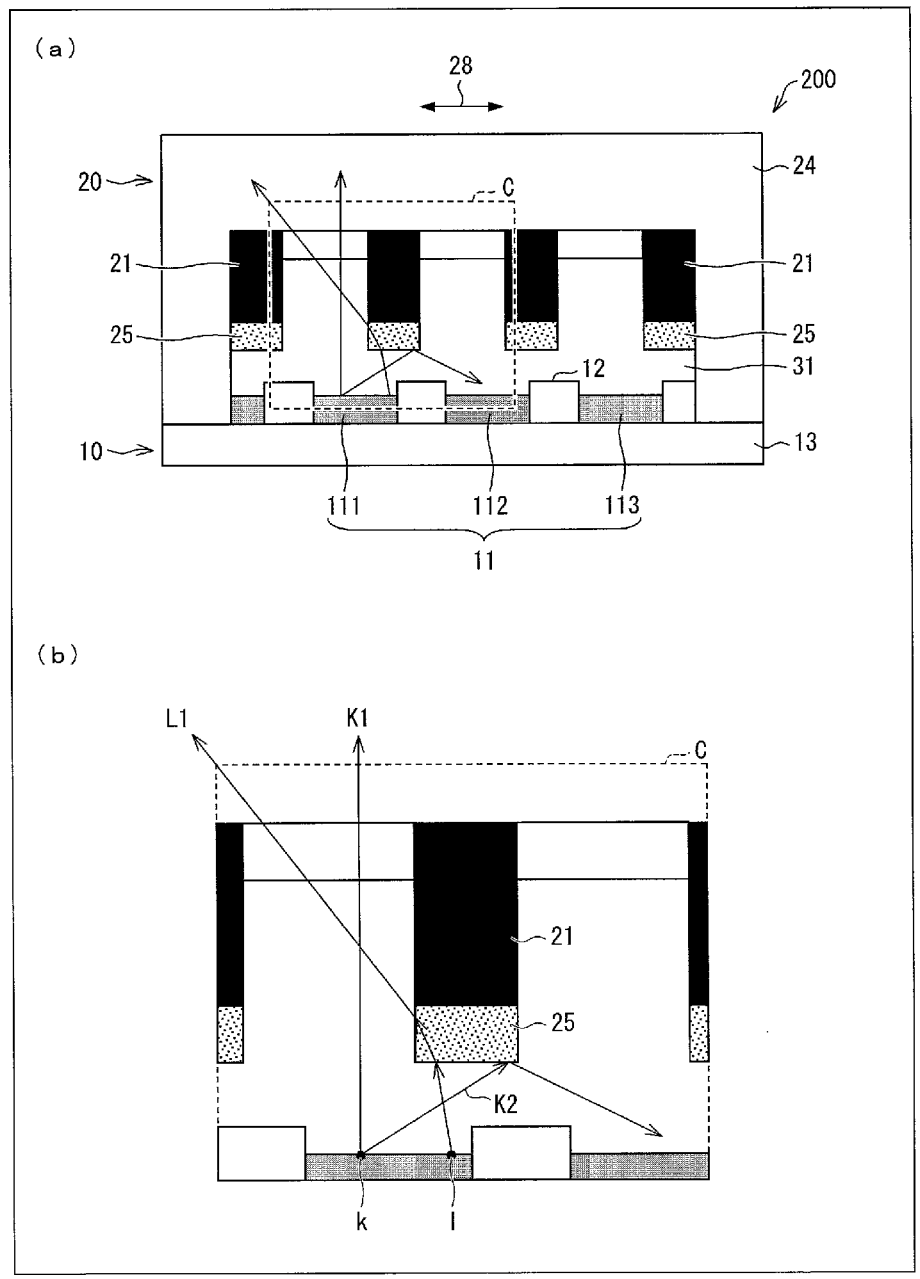

(a) of FIG. 5 is a cross sectional view of an organic EL display element in accordance with another embodiment of the present invention. (b) of FIG. 5 is a view enlarging an enclosure C of (a) of FIG. 5.

Figure 6:
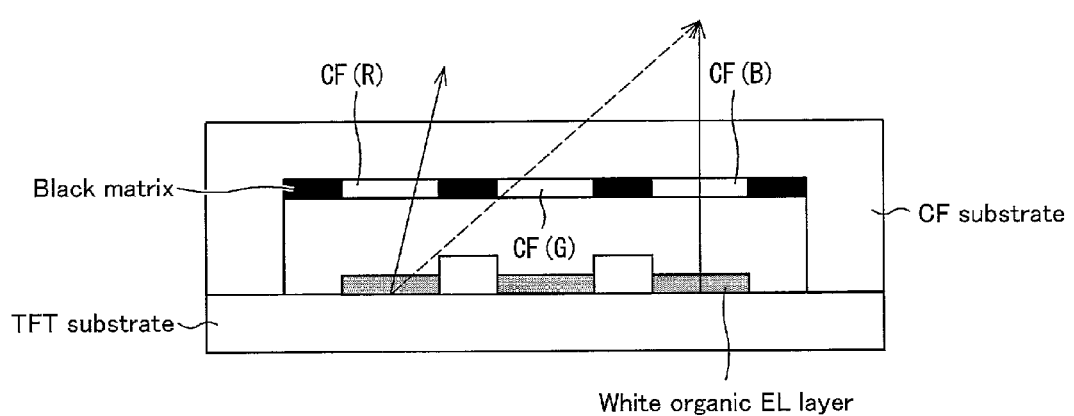

FIG. 6 is a cross sectional view illustrating a conventional organic EL display element.

Figure 7:
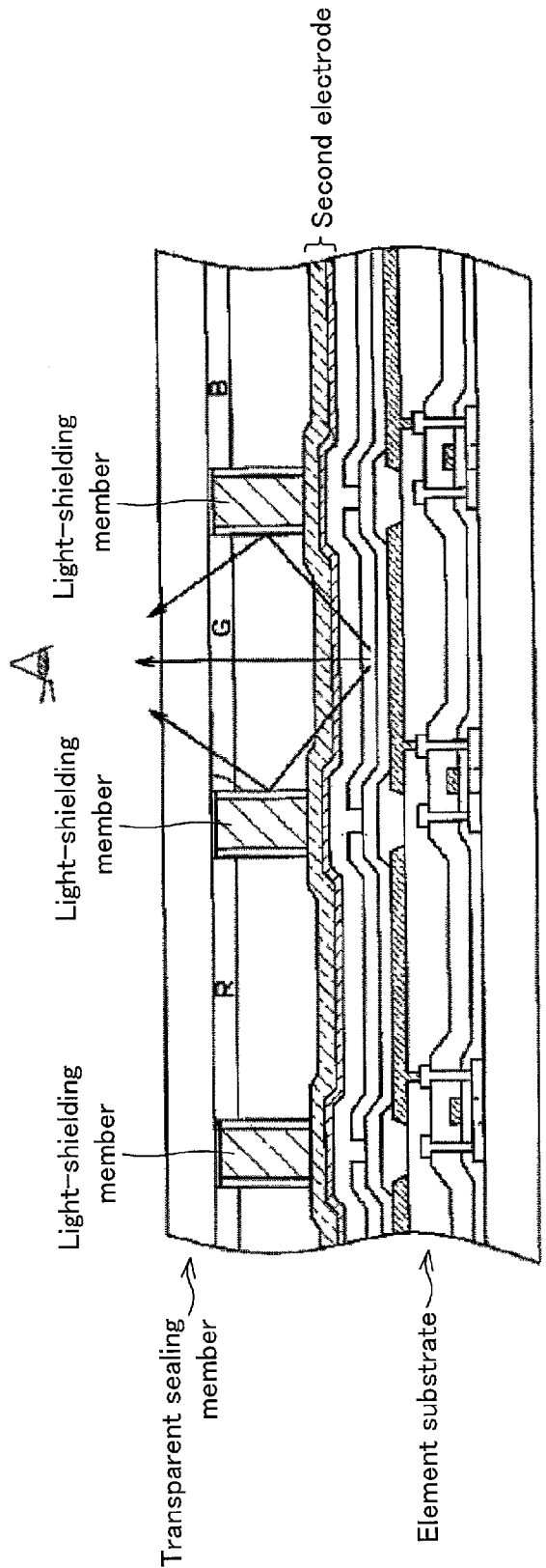

FIG. 7 is a cross sectional view illustrating a conventional organic EL display element.

Figure 8:
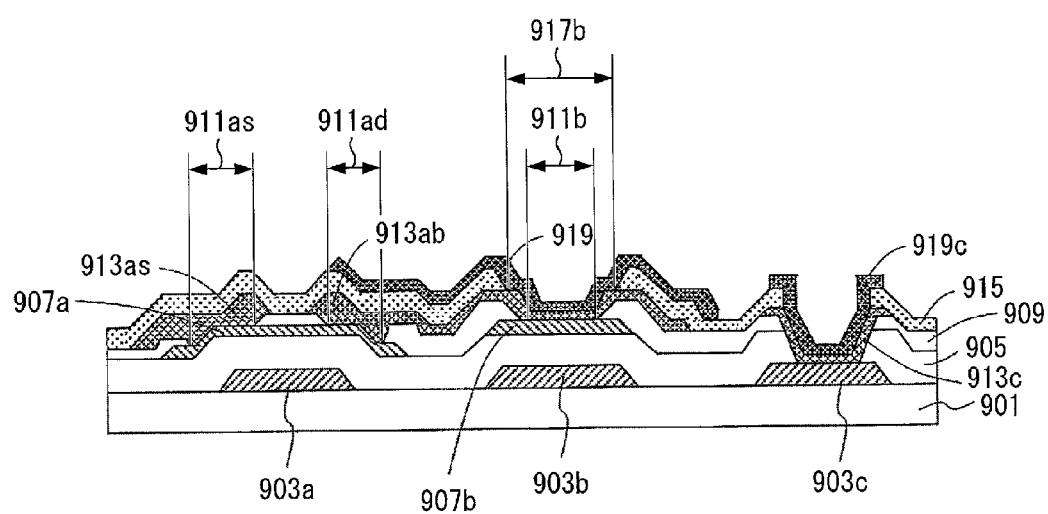

FIG. 8 is a cross sectional view illustrating a conventional TFT substrate including a semiconductor oxide layer.

DESCRIPTION OF EMBODIMENTS

The following description will discuss embodiments of the present invention in details.

[First Embodiment]

Figure 2:
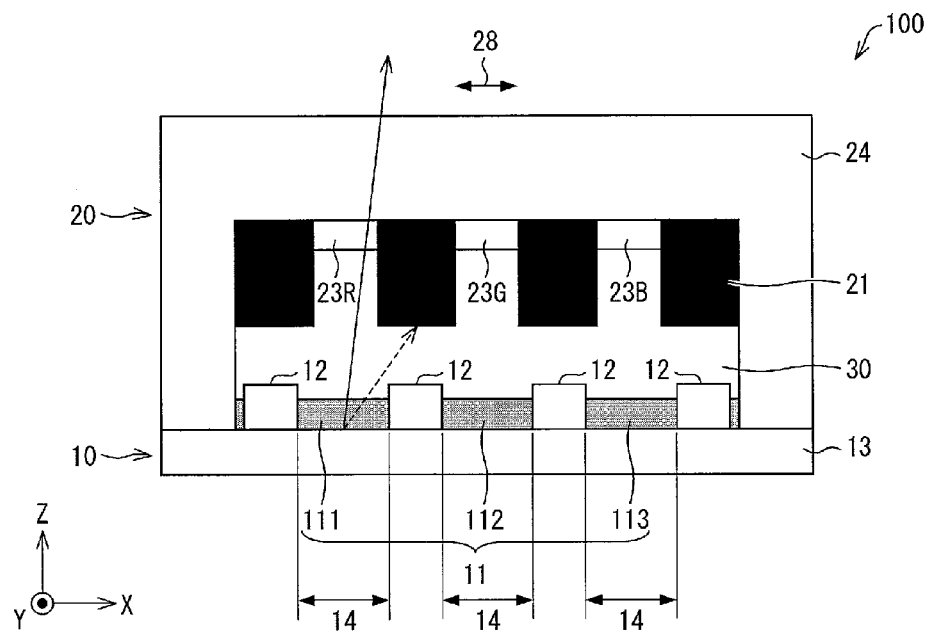
FIG. 2 is a cross sectional view of the organic EL display element taken along the line A-A' of FIG. 1.
Figure 3:
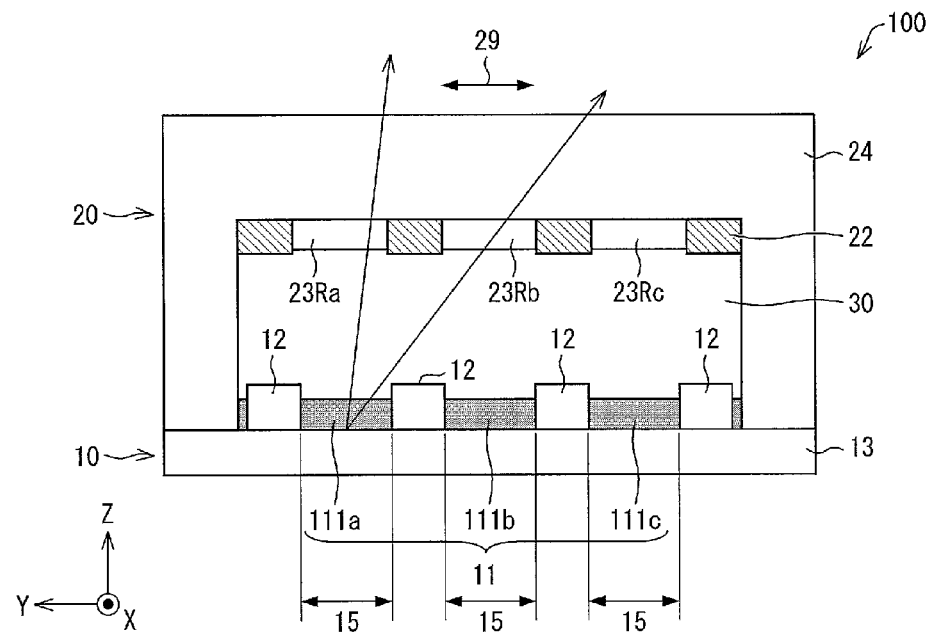
FIG. 3 is a cross sectional view of the organic EL display element taken along the line B-B' of FIG. 1.

The following description will discuss an embodiment of the present invention with reference to FIGS. 1 to 3.

FIG. 1 is a plan view illustrating an organic EL display element 100 of the present invention. FIG. 2 is a cross sectional view of the organic EL display element 100 taken along the line A-A', and FIG. 3 is a cross sectional view of the organic EL display element 100 taken along the line B-B'.

In other words, FIG. 2 is a cross sectional view of the organic EL display element 100 cut in a direction perpendicular to a direction in which the second light-shielding member 22 extends in a plan view. FIG. 3 is a cross sectional view of the organic EL display element 100 cut in a direction perpendicular to a direction in which the first light-shielding member 21 extends in a plan view.

In the description below, the X-direction in which the second light-shielding member 22 extends in FIG. 1 is regarded as a different-color direction, and the Y-direction in which the first light-shielding member 21 extends in FIG. 1 is regarded as a same-color direction.

Accordingly, FIG. 2 is a cross sectional view in the different-color direction, and FIG. 3 is a cross sectional view in the same-color direction.

<Organic EL Display Element 100>

As illustrated in FIGS. 2 and 3, the organic EL display element 100 in accordance with the present embodiment includes a TFT substrate 10 (light-emitting substrate), a color filter substrate 20, and a sealing layer 30.

The color filter substrate 20 is positioned so as to face the TFT substrate 10, and a space between the color filter substrate 20 and the TFT substrate 10 is filled with the sealing layer 30.

The sealing layer 30 may be a gas or a solid.

<TFT Substrate 10>

As illustrated in FIGS. 2 and 3, the TFT substrate 10 includes a supporting substrate 13, white organic EL layers 11 (light-emitting layer), and edge covers 12. The white organic EL layers 11 and the edge covers 12 are provided on a surface of the supporting substrate 13 which surface faces the color filter substrate 20. Portions of the supporting substrate 13 on which portions the white organic EL layers 11 are provided are referred to as pixel portions 14 (pixels).

The white organic EL layers 11 can be formed on the supporting substrate 13 through vapor deposition.

On the supporting substrate 13, TFTs, signal lines, an interlayer-insulating film etc. (each member is not shown) are provided. The TFTs are provided in such a way that one TFT is provided for one pixel portion 14. The TFT may be a conventional TFT using amorphous silicon Si. Since configuration of the TFT etc. has been well known, explanations thereof are omitted here.

The white organic EL layers 11 each include a reflecting electrode, a hole transportation layer, an electron transportation layer, an emission layer, and a counter electrode (each member is not shown). The white organic EL layers 11 each emit white light from a light-emitting layer as a result of voltage drive via the TFT.

The edge cover 12 is made of an insulating material, and prevents short-circuit between the reflecting electrode and the counter electrode of the organic EL display element 100 due to thinness of the light-emitting layer or electric field concentration at ends of the reflecting electrode.

A material for the edge cover 12 may be known photosensitive resin. Examples of the photosensitive resin include acrylic resin and polyimide resin.

Out of the white organic EL layers 11, one right below a red CF13R (mentioned later) is referred to as a white organic EL layer 111 (light-emitting section) herein, one right below a green CF13G is referred to as a white organic EL layer 112 (light-emitting section) herein, and one right below a blue CF13B is referred to as a white organic EL layer 113 (light-emitting section) herein.

In FIG. 2, the white organic EL layer 111, the white organic EL layer 112, and the white organic EL layer 113 are arranged side-by-side in this order with the edge cover 12 therebetween.

All the white organic EL layers 111 illustrated in FIG. 3 are provided right below the red CF13R, and are referred to as white organic EL layers 111a, 111b, and 111c in this order from the left of FIG. 3.

<Color Filter Substrate 20>

The color filter substrate 20 includes a transparent substrate 24 (substrate), color filter layers 23R, 23G, and 23B, a first light-shielding member 21, and a second light-shielding member 22. It is preferable that the color filter substrate of the present invention includes color filters for two or more colors. In the present embodiment, a description will be made as to a case where the color filter substrate 20 corresponds to three colors of R (red), G (green), and B (blue).

It is preferable that the first light-shielding member 21 and the second light-shielding member 22 are each made of a black-colored material. This enables the first light-shielding member 21 and the second light-shielding member 22 to absorb light incident thereto.

In a plan view, portions where the first light-shielding member 21 and the second light-shielding member 22 are not provided on the transparent substrate 24, i.e. portions which transmit light, are referred to as openings 28 and 29, respectively.

As illustrated in FIG. 1, the color filter substrate 20 is configured such that, in a plan view, a plurality of first light-shielding members 21 are provided in parallel with each other, and a plurality of second light-shielding members 22 are provided so as to be perpendicular to the plurality of first light-shielding members 21.

Furthermore, in a plan view, areas surrounded by the first light-shielding members 21 and the second light-shielding members 22, i.e. the openings 28 and 29, are provided with the color filter layers 23R, 23G, or 23B.

The red CF23R is a color filter layer which transmits light with a wavelength of red color. The green CF23G is a color filter layer which transmits light with a wavelength of green color. The blue CF23B is a color filter layer which transmits light with a wavelength of blue color.

Along a direction in which the first light-shielding member 21 extends, one of the color filter layers 23R, 23G, and 23B is provided so as to be on a plurality of openings. Furthermore, along a direction in which the second light-shielding member 22 extends, the color filter layers 23R, 23G, and 23B are provided repeatedly in this order so as to be on a plurality of openings.

Consequently, in a plan view, the first light-shielding member 21 is sandwiched by color filter layers which transmit lights of different colors, and the second light-shielding member 22 is sandwiched by color filters which transmit lights of the same color.

For example, the light-shielding member 21 is sandwiched by the red CF23R and the green CF23G, or sandwiched by the green CF23G and the blue CF23B, or sandwiched by the blue CF23B and the red CF23R.

The second light-shielding member 22 is sandwiched by adjacent two of the red CF23Rs, or sandwiched by adjacent two of the green CF23Gs, or sandwiched by adjacent two of the blue CF23Bs.

In a plan view, a thickness of the first light-shielding member 21 in a direction perpendicular to the direction in which the first light-shielding member 21 extends is referred to as a width of the first light-shielding member 21, and a thickness of the second light-shielding member 22 in a direction perpendicular to the direction in which the second light-shielding member 22 extends is referred to as a width of the second light-shielding member 22. The width of the first light-shielding member 21 is different from the width of the second light-shielding member 22. Alternatively, the width of the second light-shielding member 22 is preferably smaller than that of the first light-shielding member 21. In the present embodiment, the color filter substrate 20 is configured such that the width of the second light-shielding member 22 is smaller than that of the first light-shielding member 21.

Consequently, for example, in a case of the color filter substrate 20 of a square shape which includes the first light-shielding members 21 and the second light-shielding members 22 as many as the first light-shielding members 21, the opening 29 in FIG. 3 is larger than the opening 28 in FIG. 2.

As illustrated in FIG. 2, the first light-shielding members 21 and the color filter layers 23R, 23G, and 23B are provided on a plane of the transparent substrate 24 which plane faces the TFT substrate 10.

As illustrated in FIG. 3, the second light-shielding members 22 and the color filters 23R are provided on a plane of the color filter substrate 20 which plane faces the TFT substrate 10. The color filter layers 23R in FIG. 3 are referred to as 23Ra, 23Rb, and 23Rc in this order from the left of FIG. 3.

The first light-shielding member 21 is positioned higher than the second light-shielding member 22 on a basis of a plane of the transparent substrate 24 on which plane the light-shielding members are provided. That is, the thickness of the first light-shielding member 21 is larger than that of the second light-shielding member 22.

Furthermore, on a basis of the white organic EL layer 11, a shortest distance between the second light-shielding member 22 and the white organic EL layer 11 is longer than a shortest distance between the first light-shielding member 21 and the white organic EL layer 11.

(Cross Section in Different-color Direction)

The following description will discuss a path of light emitted from the white organic EL layer 11.

In the organic EL display element 100 illustrated in FIG. 2, white light which is emitted from the white organic EL layer 111 right below the red CF23R and which travels in a direction substantially parallel to a normal to a plane of the transparent substrate 24 on which plane the color filter layers are provided passes through the red CF23R and becomes red light, thereby contributing to red display.

White light which is emitted from the white organic EL layer 112 right below the green CF23G and which travels in a direction substantially parallel to a normal to the plane of the transparent substrate 24 on which plane the color filter layers are provided passes through the green CF23G and becomes green light, thereby contributing to green display.

White light which is emitted from the white organic EL layer 113 right below the blue CF23B and which travels in a direction substantially parallel to a normal to the plane of the transparent substrate 24 on which plane the color filter layers are provided passes through the blue CF23B and becomes blue light, thereby contributing to blue display.

On the other hand, a part of white light which is emitted from the white organic EL layer 111 and which travels in a direction not in parallel to a normal to the plane of the transparent substrate 24 on which plane the color filter layers are provided enters the first light-shielding member 21 and is absorbed by the first light-shielding member 21. Accordingly, the white light does not enter the green CF13G.

A part of white light which is emitted from the white organic EL layer 112 and which travels in a direction not in parallel to a normal to the plane of the transparent substrate 24 on which plane the color filter layers are provided enters the first light-shielding member 21 and is absorbed by the first light-shielding member 21. Accordingly, the white light does not enter the red CF13R or the blue CF13B.

A part of white light which is emitted from the white organic EL layer 113 and which travels in a direction not in parallel to a normal to the plane of the transparent substrate 24 on which plane the color filter layers are provided enters the first light-shielding member 21 and is absorbed by the first light-shielding member 21. Accordingly, the white light does not enter the green CF13G.

As described above, by designing a height of the first light-shielding member 21 from the transparent substrate 24 to be larger, white light is prevented from entering the color filter layers which correspond to pixel portions 14 adjacent to the pixel portion 14 from which the white light is emitted. This allows preventing color mixture of lights of different colors.

For example, in a case of causing a red pixel to emit light, white light is prevented from entering the green CF13G and the blue CF13B corresponding to the pixel portions 14 adjacent to the pixel portion 14 from which the white light is emitted.

(Cross Section in Same-color Direction)

Furthermore, as illustrated in FIG. 3, in the organic EL display element 100, white light which is emitted from the white organic EL layer 111a right below the red CF23Ra and which travels in a direction substantially parallel to a normal to a plane of the transparent substrate 24 on which plane the color filter layers are provided passes through the red CF13Ra and becomes red light, thereby contributing to red display.

White light which is emitted from the white organic EL layer 111a and which travels in a direction not in parallel to a normal to the plane of the transparent substrate 24 on which plane the color filter layers are provided enters the red CF13Rb which is adjacent to the red CF23Ra with the second light-shielding member 22 therebetween, without the white light being blocked by the second light-shielding member 22.

This does not cause drop in display quality due to color mixture, since each of the color filter layers adjacent in the Y-direction in FIG. 3 is the red CF23R. That is, light which is emitted from a pixel portion right below a certain color filter layer and which enters a color filter layer having the same color as that of the certain color filter does not influence appearance, and so does not cause drop in display quality.

Furthermore, in a plan view, the width of the second light-shielding member 22 can be smaller than that of the first light-shielding member 21, so that the size of the opening 29 can be secured. This allows improving an open area ratio.

<Method for Manufacturing Color Filter Substrate>

Figure 4:
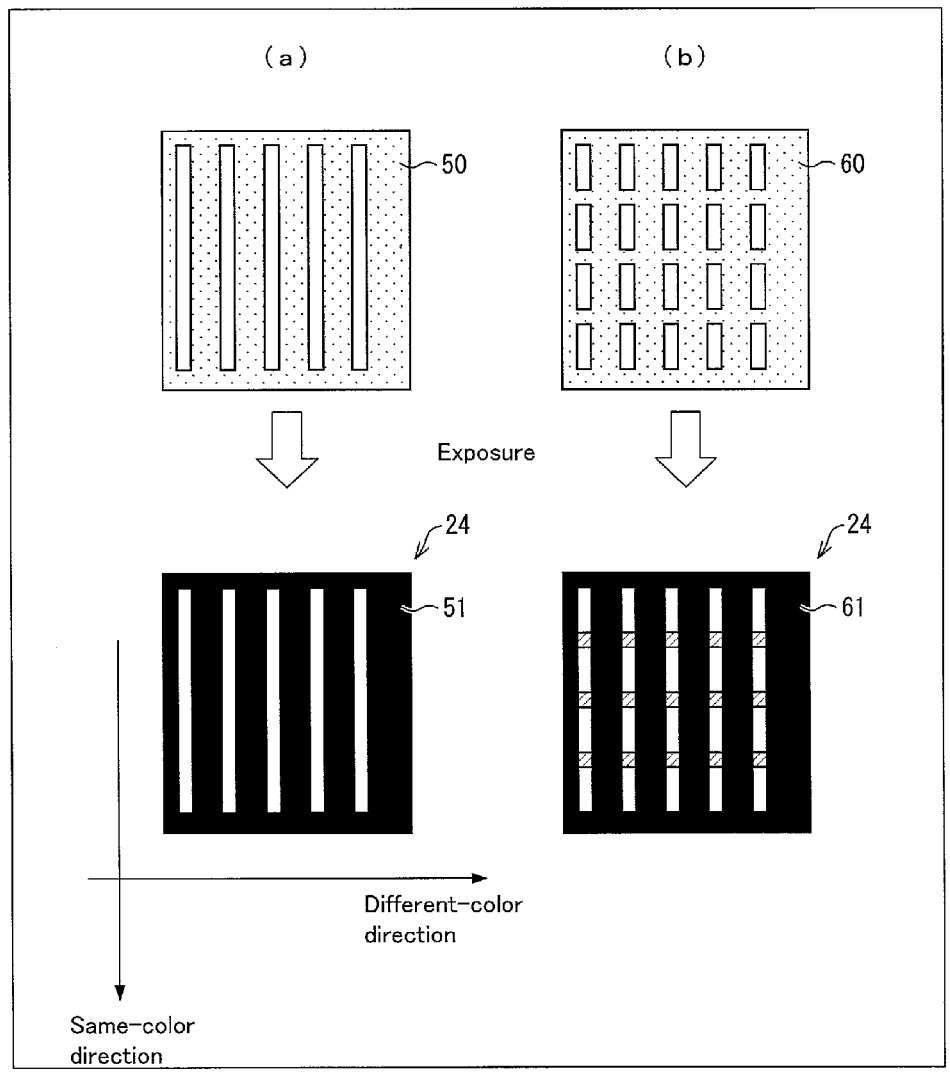
FIG. 4 is a view schematically illustrating a method for manufacturing a color filter substrate of the present invention.

The following description will discuss a part of a method for manufacturing the color filter substrate 20 of the present invention with reference to FIG. 4.

Herein, a description will be provided as to a method for manufacturing the color filter substrate 20 through photolithography using a positive photoresist.

In a first step, as illustrated in (a) of FIG. 4, the transparent substrate 24 on all of which a black resist is applied is exposed with use of a first photo mask 50.

The first photo mask 50 has a plurality of oblong openings whose long side directions are equal to the same-color direction (first direction). The oblong openings are aligned with a certain distance therebetween, and long side directions of the openings are parallel to each other.

That is, every two first oblong openings which are adjacent in a direction in which short sides thereof extend have the same distance between long sides thereof.

Consequently, a light-shielding layer 51 having slit-like openings is formed.

In a second step, as illustrated in (b) of FIG. 4, the transparent substrate 24 on which the light-shielding layer 51 has been formed and on all of which a new black resist is applied is exposed with a second photo mask 60.

The second photo mask 60 has a plurality of oblong openings. The oblong openings are provided in a matrix manner so that individual oblongs are aligned with a certain distance in a direction in which short sides of each oblong extend, and with a certain distance in a direction in which long sides of each oblong extend. That is, the second photo mask 60 has masking portions which mask a part of the openings of the first photo mask 50 in the different-color direction (second direction) crossing the same-color direction.

Consequently, a new light-shielding layer 61 is formed.

As described above, through the two photoresist steps, it is possible to form, on the transparent substrate 24, light-shielding members having different thicknesses depending on their positions.

Here, a distance between the masking portions of the second photo mask 60 is smaller than a distance between the openings of the first photo mask 50. Consequently, the light-shielding members are formed in such a manner that a portion of the light-shielding members which portion is small in width in a plan view has a small thickness from the color filter substrate 20, and a portion of the light-shielding members which portion is large in width in a plan view has a large thickness from the color filter substrate 20.

By setting relations among (i) the distance between the masking portions of the second photo mask 60, (ii) the distance between the openings of the first photo mask 50, and (iii) the thickness of the light-shielding members as above, it is possible to reduce a risk that light emitted obliquely to a resist surface enters a resist portion with a large thickness and the light-shielding members are peeled off from the color filter substrate 20. Furthermore, at a resist portion with a small thickness to which light entered obliquely to a resist surface does not enter, it is possible to reduce a width of a resist (width of making portion) in a plan view, thereby improving an open area ratio of the color filter substrate 20.

Furthermore, by forming color filter layers at portions where the light-shielding layers 51 and 61 are not formed, it is possible to manufacture the color filter substrate 20 of the present invention.

That is, it is possible to manufacture the color filter substrate 20 which has, in the X-direction in FIG. 4, the first light-shielding members 21 each having a thickness equal to a laminate of the light-shielding layers 51 and 61, and which has, in the Y-direction in FIG. 4, the second light-shielding members 22 each having a thickness equal to a thickness of the light-shielding layer 61.

In a case of forming a pattern of the light-shielding members by using a negative photoresist, it is possible to manufacture a color filter substrate similar to the color filter substrate 20 by using photo masks whose openings and masking portions are positioned oppositely to those of the first photo mask 50 and the second photo mask 60.

[Second Embodiment]

The following description will discuss another embodiment of the present invention with reference to FIG. 5.

For convenience, members having the same functions as those in the drawings explained in First Embodiment are given the same reference signs and explanations thereof are omitted.

(a) of FIG. 5 is a cross sectional view of an organic EL display element 200 in a different-color direction, in accordance with the present embodiment. (b) of FIG. 5 is a view enlarging a portion C of (a) of FIG. 5.

In a step of attaching the color filter substrate 20 and the TFT substrate 10 to each other, when positional relations between the pixel portions 14 of the TFT substrate 10 and the openings 28 of the color filter substrate 20 are different from those as designed, there is a possibility of drop in display quality due to color mixture.

In order to solve this problem, the organic EL display element 200 in accordance with the present embodiment is designed such that a space between the color filter substrate 20 and the TFT substrate 10 is filled with a transparent filling resin layer 31 (medium).

Furthermore, each of the first light-shielding members 21 is provided with a low-refractive index transparent resin layer 25 (low-refractive index layer) on a surface thereof, which carries out a low-refractive index treatment on the first light-shielding members 21.

<Low-refractive Index Transparent Resin Layer 25>

The low-refractive index transparent resin layer 25 is provided on a plane of the first light-shielding member 21 which plane faces the TFT substrate 10. The low-refractive index transparent resin layer 25 is oblong, and has the same area as that of the first light-shielding member 21 at a plane where the low-refractive index transparent resin layer 25 faces the first light-shielding member 21. Furthermore, the low-refractive index transparent resin layer 25 has an oblong cross section in a direction perpendicular to the transparent substrate 24.

The low-refractive index transparent resin layer 25 is made of a material having a lower refractive index than that of the filling resin layer 31.

The low-refractive index transparent resin layer 25 preferably has a refractive index of 1.4 or less.

For example, the filling resin layer 31 may be made of Lumiplus (refractive index: 1.64-1.71) produced by Mitsubishi Chemical Corporation or a resin material (refractive index: 1.64) produced by JSR Corporation, and the low-refractive index transparent resin layer 25 may be made of Meso-plus (refractive index: 1.2-1.3) which is a coating material produced by Nippon Kasei Chemical Co., Ltd. or photo-curing resin (refractive index: 1.33) produced by JSR Corporation.

In a case of forming the low-refractive index transparent resin layer 25 by mask exposure, it is preferable to use photo-curing resin.

(a) of FIG. 5 illustrates a path of light emitted from the white organic EL layer 111 in a case where the first light-shielding member 21 is provided with the low-refractive index transparent resin layer 25. For convenience, a description will be made below as to paths of lights emitted from points k and l on the white organic EL layer 111 only in a case where a width of displacement caused when attaching the color filter substrate 20 to the TFT substrate 10 is sufficiently small with respect to the pixels 14.

(Light Emitted from Point k)

Light emitted from the point k of the white organic EL layer 111 toward a direction of a normal to a plane of the transparent substrate 24 on which plane CF layers are formed travels on a light path K1. That is, the light passes through a CF layer provided right above the white organic EL layer 111. Consequently, the light which is emitted from the point k of the white organic EL layer 111 and travels on the light path K1 contributes to display.

Light which is emitted from the point k and which travels on a light path K2 toward a CF layer having a color different from that of the CF layer right above the white organic EL layer 111 enters the low-refractive index transparent resin layer 25. In a case where an incident angle of the light path K2 to the low-refractive index transparent resin layer 25 is larger than a critical angle determined by refractive indices of the filling resin layer 31 and the low-refractive index transparent resin layer 25, the light traveling on the light path K2 is totally reflected at an interface between the filling resin layer 31 and the low-refractive index transparent resin layer 25. Consequently, the light traveling on the light path K2 does not enter the CF layer having a color different from that of the CF layer right above the white organic EL layer 111, allowing prevention of color mixture.

(Light Emitted from Point 1)

Light emitted from the point 1 of the white organic EL layer 111 and which travels on a light path L1 toward a CF layer having the same color as that of the CF layer right above the white organic EL layer 111 enters the low-refractive index transparent resin layer 25. The light which travels on the light path L1 toward the CF layer having the same color enters the low-reflectance transparent resin layer 25 with a sufficiently small incident angle. By designing the low-refractive index transparent resin layer 25 to have a low refractive index than that of the filling resin layer 31, the light traveling on the light path L1 is refracted and changes its path, and finally passes through the low-refractive index transparent resin layer 25. Consequently, the light enters the CF layer without entering the first light-shielding member 21, thereby contributing to display.

As described above, the light entering the low-refractive index transparent resin layer 25 with a large incident angle, i.e. the light traveling toward the CF layer with a different color, has an incident angle larger than the critical angle, so that the light is totally reflected at the boundary between the layers. On the other hand, the light entering the low-refractive index transparent resin layer 25 with a small incident angle passes through the low-refractive index transparent resin layer 25.

In order to enhance an effect of preventing color mixture by the low-refractive index transparent resin layer 25, it is preferable to set the critical angle to be lower. That is, it is preferable that the filling resin layer 31 has as large refractive index as possible, and the low-refractive index transparent resin layer 25 has as small refractive index as possible.

(Method for Manufacturing Low-refractive Index Transparent Resin Layer 25)

The low-refractive index transparent resin layer 25 can be made of, for example, UV curing resin. UV curing resin is applied on the color filter substrate 20 on which the first light-shielding members 21 are formed, and the resin is subjected to UV mask exposure so as to be cured. Thereafter, the resin which is not cured is washed away with an organic solvent, so that a pattern of the low-refractive index transparent resin layer 25 can be formed.

A description was made above as to a case where the TFT substrate 10 has, as a TFT element serving as a switching element for controlling emission of light, a conventional TFT element employing amorphous silicon Si. However, the present invention is not limited to this case.

As illustrated in FIG. 9, the TFT element may be a TFT element including a semiconductor oxide layer. Use of a TFT including a semiconductor oxide having high electron mobility allows drive with a smaller TFT element, thereby allowing designing a high-definition panel with a smaller pixel size.

In the conventional art, downsizing of a pixel size results in relative increase in a ratio of an area of a light-shielding member to the pixel size. Consequently, if a width of the light-shielding member is not reduced so as to compensate for the relative increase, then an open area ratio drops.

In this case, designing both of the light-shielding member in the same-color direction and the light-shielding member in the different-color direction to be smaller would result in insufficient heights of the light-shielding members, inevitably causing color mixture.

In contrast, the color filter substrate 20 of the present invention is designed such that the light-shielding member in the same-color direction and the light-shielding member in the different-color direction have different heights, so that it is possible to deal with color mixture while keeping a sufficient open area ratio.

The semiconductor oxide above may be made of IGZO. IGZO is an oxide composed of indium and gallium.

A description was made above as to a case where the light-emitting layer is the white organic EL layer 11. However, the present invention is not limited to this case. The light-emitting layer may be a colored organic EL layer which emits different lights (red, green, blue etc.) per pixel. In a case where the light-emitting layer is a colored organic EL, a color filter layer is not necessarily required. In either case, the color filter substrate 20 including the first light-shielding members 21 and the second light-shielding members 22 can be used.

A description was made above as to cases where the organic EL display element 100 and the organic EL display element 200 are designed such that the number of the white organic EL layers 11 is equal to the number of openings of the color filter substrate 20. However, the present invention is not limited to this case. The number of the white organic EL layers 11 may be larger or smaller than the number of openings of the color filter substrate 20.

[Summary Of Embodiments]

The color filter substrate of the present invention is arranged such that the light-shielding members provided in a matrix manner have different thicknesses on the substrate depending on directions in which the light-shielding members extend.

With the arrangement, it is possible to prevent color mixture of lights passing through the color filter substrate depending on directions in which the light-shielding members extend.

The color filter substrate of the present invention is arranged such that the substrate has color filters at regions surrounded by the light-shielding members, the color filters correspond to at least two colors, and the light-shielding members include (i) first light-shielding members each provided between adjacent color filters of different colors of the color filters and (ii) second light-shielding members each provided between adjacent color filters of a same color of the color filters, and the first light-shielding members are larger in thickness than the second light-shielding members.

With the arrangement, lights passing through color filter layers of the same color which are provided on different regions are mixed with each other, but lights passing through color filter layers of different colors which are provided on different regions are prevented from being mixed with each other.

Consequently, color mixture can be prevented depending on wavelengths of lights transmitted by the color filter layers.

The color filter substrate of the present invention is arranged such that in a plan view, the second light-shielding members each have a width smaller than that of each of the first light-shielding members.

With the arrangement, in a plan view, the second light-shielding members each can have a width smaller than that of each of the first light-shielding members, so that in a plan view, the area occupied by the light-shielding members can be reduced. This allows providing a color filter substrate which has an improved open area ratio and which can transmit a larger amount of light.

The color filter substrate of the present invention is arranged such that at least a surface of the first light-shielding members which surface is not in contact with the substrate is provided with a low-refractive index layer.

With the arrangement, it is possible to refract light depending on an incident angle of the light to the low-refractive index layer on the color filter substrate.

Consequently, it is possible to cause the color filter substrate to transmit or not transmit the light depending on the incident angle of the light to the low-refractive index layer.

The color filter substrate of the present invention is arranged such that the low-refractive index layer has a refractive index of 1.4 or less.

With the arrangement, it is possible to totally reflect light depending on an incident angle of the light to the low-refractive index layer.

Consequently, it is possible to cause the color filter substrate to transmit or not transmit the light depending on the refractive index of the low-refractive index layer and the incident angle of the light to the low-refractive index layer. The color filter substrate of the present invention is arranged such that the low-refractive index layer is made of transparent resin.

With the arrangement, it is possible to prevent attenuation of light incident to the low-refractive index layer.

The color filter substrate of the present invention is arranged such that the low-refractive index layer has a surface parallel to the substrate, and the low-refractive index layer has an oblong cross section in a direction perpendicular to the substrate.

With the arrangement, light which enters the low-refractive index layer on the light-shielding members with a relatively small incident angle is refracted by the low-refractive index layer, so that the light passes through the color filter substrate without entering the light-shielding members.

On the other hand, light which enters the low-refractive index layer on the light-shielding members with a relatively large incident angle is totally reflected by the low-refractive index layer so that the light does not pass through the color filter substrate.

Consequently, it is possible to cause the color filter substrate to transmit or not transmit the light depending on the incident angle of the light to the low-refractive index layer.

In order to solve the foregoing problem, a display element of the present invention is a display element, including the aforementioned color filter substrate and a light-emitting substrate which faces the color filter substrate, the light-emitting substrate including a plurality of light-emitting sections for emitting lights, and a shortest distance between the second light-shielding members and the plurality of light-emitting sections is longer than a shortest distance between the first light-shielding members and the plurality of light-emitting sections.

With the arrangement, since each of the second light-shielding members is provided between color filters of the same color, color mixture due to lights with different colors does not occur.

Furthermore, the first light-shielding members, each of which are provided between color filters of different colors, are positioned to be closer to the light-emitting sections than the second light-shielding members are, so that the first light-shielding members shield light which would cause color mixture. Consequently, color mixture does not occur.

A display element of the present invention is a display element, including the aforementioned color filter substrate and a light-emitting substrate which faces the color filter substrate, the light-emitting substrate including a plurality of light-emitting sections for emitting different lights per pixel, and a shortest distance between (i) one of the light-shielding members which is provided, in a plan view, between adjacent light-emitting sections which emit a same color and (ii) said adjacent light-emitting sections being longer than a shortest distance between (iii) one of the light-shielding members which is provided, in a plan view, between adjacent light-emitting sections which emit different colors and (iv) said adjacent light-emitting sections.

With the arrangement, lights of the same color which are emitted from adjacent light-emitting sections are mixed with each other, whereas lights of different colors emitted from adjacent light-emitting sections are prevented from being mixed with each other.

Furthermore, in a plan view, since the width of each of the light-shielding members can be reduced, the area occupied by the light-shielding members on the color filter substrate can be reduced. This allows providing a display element with an improved open area ratio.

A display element of the present invention is a display element, including the aforementioned color filter substrate and a light-emitting substrate which faces the color filter substrate, the low-refractive index layer having a refractive index lower than that of a medium adjacent to the low-refractive index layer.

With the arrangement, in a case where light from the medium enters the low-refractive index layer with a relatively small incident angle, the light is refracted, so that the light passes through the color filter substrate without entering the light-shielding members.

On the other hand, in a case where light from the medium enters the low-refractive index layer with a relatively large incident angle, the light is totally reflected, so that the light does not pass through the color filter substrate.

Consequently, it is possible to cause the color filter substrate to transmit or not transmit the light depending on the incident angle of the light from the medium to the low-refractive index layer.

The display element of the present invention is arranged such that the light-emitting section includes a TFT element serving as a switching element for controlling emission of light, and the TFT element is made of a semiconductor oxide.

With the arrangement, use of a TFT having high electron mobility allows downsizing the display element.

The method of the present invention is arranged such that the first step and the second step are each a step of forming the light-shielding members through photolithography, a first photo mask used in the first step has one or more oblong openings whose long sides extend in the first direction, and a second photo mask used in the second step has masking portions for masking a part of said one or more oblong openings of the first photo mask in the second direction.

With the arrangement, in the color filter substrate, the light-shielding members have different thicknesses on the substrate depending directions in which the light-shielding members are provided on the substrate.

The method of the present invention is arranged such that said one or more oblong openings of the first photo mask include a plurality of openings, and a distance between adjacent ones of the plurality of openings is longer than a width of each of the masking portions of the second photo mask.

With the arrangement, the width of each of the light-shielding members which was produced only in the first step can be smaller than that of each of the light-shielding members which was produced both in the first and second steps.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is applicable to a color filter substrate used in a display device, particularly an organic EL display device.

REFERENCE SIGNS LIST

10 TFT substrate
11 White organic EL layer
12 Edge cover
13 Supporting substrate
14 Pixel portion
20 Color filter substrate
21 First light-shielding member
22 Second light-shielding member
23R Red CF
23G Green CF
23B Blue CF
24 Transparent substrate
25 Low-refractive index transparent resin layer
28 Opening
29 Opening
30 Sealing layer
31 Filling resin layer
50 First photo mask
51 Light-shielding layer
60 Second photo mask
61 Light-shielding layer
100 Organic EL display element
111 White organic EL layer
112 White organic EL layer
113 White organic EL layer
111a White organic EL layer
111b White organic EL layer
111c White organic EL layer
200 Organic EL display element
K1, K2 Light path
L1 Light path

The invention claimed is:

1. A color filter substrate, comprising:
a substrate; and
light-shielding members provided in a matrix manner on the substrate,
the light-shielding members having different thicknesses on the substrate depending on positions of the light-shielding members, wherein
the substrate has color filters at regions surrounded by the light-shielding members,
the color filters correspond to at least two colors,
the light-shielding members include (i) first light-shielding members each provided between adjacent color filters of different colors of the color filters and (ii) second light-shielding members each provided between adjacent color filters of a same color of the color filters, and the first light-shielding members are larger in thickness than the second light-shielding members, and
at least a surface of the first light-shielding members which surface is not in contact with the substrate is provided with a low-refractive index layer.

2. The color filter substrate as set forth in claim 1, wherein the low-refractive index layer has a refractive index of 1.4 or less.

3. The color filter substrate as set forth in claim 1, wherein the low-refractive index layer is made of transparent resin.

4. The color filter substrate as set forth in claim 1, wherein
the low-refractive index layer has a surface parallel to the substrate, and
the low-refractive index layer has an oblong cross section in a direction perpendicular to the substrate.

5. A display element, comprising a color filter substrate as set forth in claim 1 and a light-emitting substrate which faces the color filter substrate,
the light-emitting substrate including a plurality of light-emitting sections for emitting different lights per pixel, and
a shortest distance between (i) one of the light-shielding members which is provided, in a plan view, between adjacent light-emitting sections which emit a same color and (ii) said adjacent light-emitting sections being longer than a shortest distance between (iii) one of the light-shielding members which is provided, in a plan view, between adjacent light-emitting sections which emit different colors and (iv) said adjacent light-emitting sections.

6. A display element, comprising a color filter substrate as set forth in claim 1 and a light-emitting substrate which faces the color filter substrate,
the low-refractive index layer having a refractive index lower than that of a medium adjacent to the low-refractive index layer.

* * * * *